(12) United States Patent
Yabuta

(10) Patent No.: US 11,994,650 B2
(45) Date of Patent: May 28, 2024

(54) ANTIGLARE FILM-ATTACHED SUBSTRATE, IMAGE DISPLAY APPARATUS, AND DIGITAL SIGNAGE

(71) Applicant: Nippon Sheet Glass Company, Limited, Tokyo (JP)

(72) Inventor: Takeshi Yabuta, Hyogo (JP)

(73) Assignee: NIPPON SHEET GLASS COMPANY, LIMITED, Tokyo (JP)

( * ) Notice: Subject to any disclaimer, the term of this patent is extended or adjusted under 35 U.S.C. 154(b) by 768 days.

(21) Appl. No.: 17/251,463

(22) PCT Filed: Jun. 12, 2019

(86) PCT No.: PCT/JP2019/023304
§ 371 (c)(1),
(2) Date: Dec. 11, 2020

(87) PCT Pub. No.: WO2019/240178
PCT Pub. Date: Dec. 19, 2019

(65) Prior Publication Data
US 2021/0255364 A1    Aug. 19, 2021

(30) Foreign Application Priority Data
Jun. 13, 2018    (JP) .................. 2018-112649

(51) Int. Cl.
G02B 5/02    (2006.01)
G02B 1/11    (2015.01)
H10K 59/80    (2023.01)

(52) U.S. Cl.
CPC .............. *G02B 1/11* (2013.01); *G02B 5/0294* (2013.01)

(58) Field of Classification Search
CPC ...... G02B 1/11; G02B 5/0294; G02B 5/0221; G02B 5/0226; G02B 5/0242; H10K 59/8791
See application file for complete search history.

(56) References Cited

U.S. PATENT DOCUMENTS

2009/0059377 A1    3/2009    Kameshima et al.
2014/0146454 A1    5/2014    Nozawa
(Continued)

FOREIGN PATENT DOCUMENTS

JP    H10133002    5/1998
JP    2008304638    12/2008
(Continued)

OTHER PUBLICATIONS

International Search Report and Written Opinion issued for International Patent Application No. PCT/JP2019/023304, dated Sep. 17, 2019, 10 pages including English translation of Search Report.
(Continued)

*Primary Examiner* — Ryan D Howard
(74) *Attorney, Agent, or Firm* — HSML P.C.

(57) ABSTRACT

An antiglare film-attached substrate (1a) includes a substrate (10) and an antiglare film (20). The substrate (10) includes a first principal surface (11), and a portion of the first principal surface (11) is exposed. The antiglare film (20) covers another portion of the first principal surface (11). The antiglare film-attached substrate (1a) includes a second principal surface (25) having unevenness and formed of the first principal surface (11) and the surface of the antiglare film (20). When the second principal surface (25) is viewed in plan, the area of the antiglare film (20) accounts for 10 to 90% of the area of the second principal surface (25).

16 Claims, 2 Drawing Sheets

(56) References Cited

U.S. PATENT DOCUMENTS

| | | |
|---|---|---|
| 2014/0168757 A1 | 6/2014 | Kim et al. |
| 2018/0033986 A1 | 2/2018 | Takai et al. |
| 2018/0099307 A1 | 4/2018 | Takeda et al. |
| 2018/0251398 A1 | 9/2018 | Ikegami et al. |

FOREIGN PATENT DOCUMENTS

| | | |
|---|---|---|
| JP | 2009042499 | 2/2009 |
| JP | 2009058862 | 3/2009 |
| JP | 2013136496 | 7/2013 |
| JP | 2015158537 | 9/2015 |
| JP | 2016018068 | 2/2016 |
| JP | 2018024240 | 2/2018 |
| WO | 2013015039 | 1/2013 |
| WO | 2013066850 A2 | 5/2013 |
| WO | 2017043538 | 3/2017 |

OTHER PUBLICATIONS

Extended European Search Report issued for European Patent Application No. 19819863.2, dated Feb. 23, 2022, 10 pages.

ANTIGLARE FILM-ATTACHED SUBSTRATE, IMAGE DISPLAY APPARATUS, AND DIGITAL SIGNAGE

TECHNICAL FIELD

The present invention relates to an antiglare film-attached substrate, an image display apparatus, and a digital signage.

BACKGROUND ART

Substrates included in image display apparatuses and digital signages are required to prevent the surfaces of the substrates from reflecting lighting equipment, such as a fluorescent lamp, or a background and thereby improve the visibility of images displayed. From this point of view, formation of an antiglare film on the surfaces of substrates is known.

For example, Patent Literature 1 describes an article including an antiglare film on the surface of a substrate. The haze of the article is 15% or more, and the specular glossiness on the surface of the antiglare film is 25% or less at 60°. The arithmetic average roughness Ra of the surface of the antiglare film is 0.17 μm or more. The antiglare film is, for example, a film having unevenness on its surface and including inorganic particles in a matrix formed by baking a matrix precursor such as a silica precursor.

Patent Literature 2 describes an antiglare film whose surface has a fine uneven shape, an average inclination angle θa of 0.2° to 1.5°, and an arithmetic average roughness Ra of 0.05 to 0.4. The fine uneven shape is formed by aggregation of fine particles. The fine uneven shape is formed, for example, by a method for forming a Bénard cell.

Patent Literature 3 describes an antiglare film including, on a transparent substrate, an antiglare layer including particles and a binder matrix. The antiglare layer includes an uneven structure showing a given ten point height of roughness profile ($Rz_1$) at a given cut-off wavelength (λc).

Patent Literature 4 describes an antireflection film capable of achieving a good antiglare effect. This antireflection film is formed by mixing fine particles with a liquid sol prepared by a sol-gel process, coating a substrate with the mixture, and baking the coated substrate. In the antireflection film, the surface of the antireflection film is formed to have an uneven shape having a given pitch by aggregation of fine particles. For example, about 150 to 300 particles aggregate together to form an aggregates.

Patent Literature 5 describes an antiglare glass substrate including a glass substrate and a transparent layer formed on a surface of the glass substrate. A first uneven surface which is a surface of the glass substrate and a second uneven surface which is a surface of the transparent layer have given arithmetic average roughness (Ra) and pitch (Sm).

CITATION LIST

Patent Literature

Patent Literature 1: JP 2015-158537 A
Patent Literature 2: JP 2008-304638 A
Patent Literature 3: JP 2009-058862 A
Patent Literature 4: JP H10-133002 A
Patent Literature 5: JP 2013-136496 A

SUMMARY OF INVENTION

Technical Problem

According to the techniques described in Patent Literatures 1 to 5, the entire principal surfaces of the substrates is covered by the antiglare films or the like, and it is not expected that transmitted light rays pass through the substrates only. Therefore, the present invention provides an antiglare film-attached substrate having antiglare properties and allowing a portion of transmitted light rays to pass through the substrate only. Moreover, the present invention provides an image display apparatus including such an antiglare film-attached substrate and a digital signage including such an antiglare film-attached substrate.

Solution to Problem

The present invention provides an antiglare film-attached substrate including:
a substrate including a first principal surface, a portion of the first principal surface being exposed; and
an antiglare film covering another portion of the first principal surface, wherein
the antiglare film-attached substrate includes a second principal surface having unevenness and formed of the first principal surface and the surface of the antiglare film, and
when the second principal surface is viewed in plan, the area of the antiglare film accounts for 10 to 90% of the area of the second principal surface.

The present invention also provides an image display apparatus including:
an image display unit having a screen; and
the above antiglare film-attached substrate disposed in such a manner that the substrate is located between the screen and the antiglare film.

The present invention also provides a digital signage including:
an image display unit having a screen; and
the above antiglare film-attached substrate disposed in such a manner that the substrate is located between the screen and the antiglare film, wherein
the substrate includes glass.

Advantageous Effects of Invention

The above antiglare film-attached substrate has antiglare properties owing to the antiglare film. Additionally, the exposure of the portion of the first principal surface of the substrate allows a portion of transmitted light rays to pass through the substrate only.

DESCRIPTION OF EMBODIMENTS

Hereinafter, embodiments of the present invention will be described with reference to the drawings. The following description relates to examples of the present invention, and the present invention is not limited to the following embodiments.

It seems desirable that in order to achieve good antiglare performance by means of an antiglare structure having a particular uneven shape, an antiglare film providing the uneven shape cover the entire principal surface of a substrate. The present inventor, however, newly found that with such an antiglare film covering the entire principal surface of a substrate, it is difficult to adjust a gloss level of the antiglare film-attached substrate in a wide range and improve sharpness of a transmission image, although good antiglare performance can be achieved. Therefore, the present inventor went through a lot of trial and error to newly invent an antiglare film-attached substrate advantageous in terms of good antiglare performance, ease of adjustment of the gloss level, and sharpness of a transmission image. That eventually led the present inventor to newly find out that exposure of a portion of a principal surface of a substrate and adjustment of the area of an antiglare film covering the principal surface of the substrate in a given range were advantageous. The antiglare film-attached substrate according to the present invention has thus been invented.

Figure 1A:
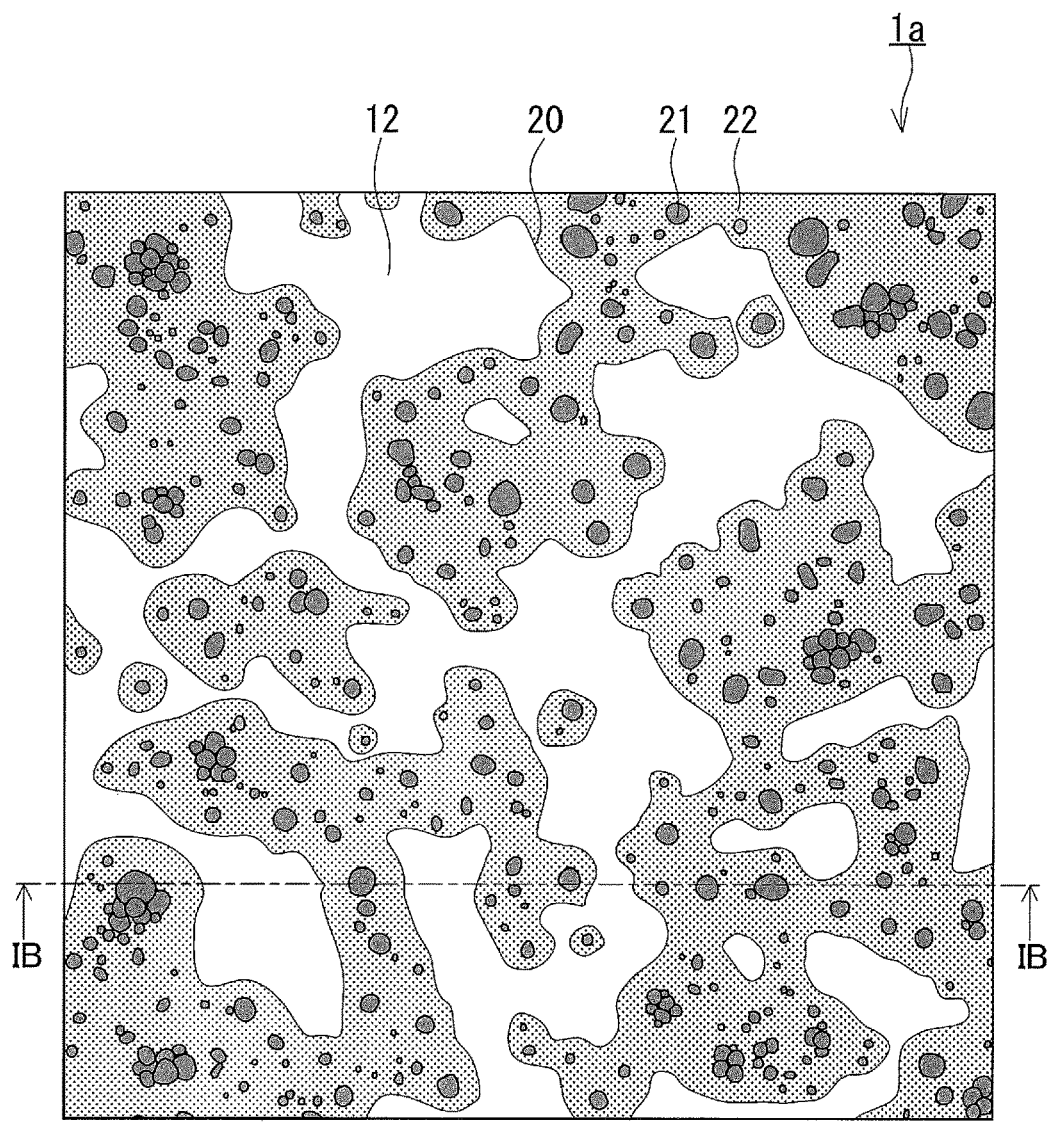
FIG. 1A is a plan view schematically showing an antiglare film-attached substrate according to an example of the present invention.
Figure 1B:
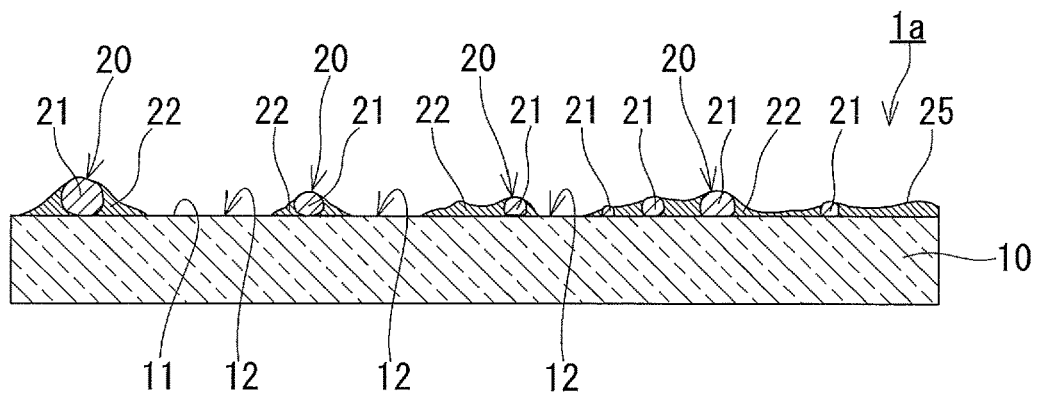
FIG. 1B is a cross-sectional view of the antiglare film-attached substrate viewed along the line IB-IB in FIG. 1A.

As shown in FIG. 1A and FIG. 1B, an antiglare film-attached substrate 1a includes a substrate 10 and an antiglare film 20. The substrate 10 includes a first principal surface 11, and a portion of the first principal surface 11 is exposed. Hence, the substrate 10 has an exposed portion 12. The antiglare film 20 covers another portion of the first principal surface 11. In other words, the antiglare film 20 covers a portion of the first principal surface 11. The portion is different from the exposed portion 12. A second principal surface 25 having unevenness is formed of the first principal surface 11 and the surface of the antiglare film 20. When the second principal surface 25 is viewed in plan, the area of the antiglare film 20 accounts for 10 to 90% of the area of the second principal surface 25.

Typically, regular refection of incident light occurs on the portion of the first principal surface 11 as the exposed portion 12. Therefore, the gloss level of the antiglare film-attached substrate 1a is easily affected by the ratio of the area of the exposed portion 12 to the area of the second principal surface 25 viewed in plan. The gloss level of the antiglare film-attached substrate 1a is easily adjusted in a wide range by adjusting the area of the antiglare film 20 in the above range. Meanwhile, the surface of the antiglare film 20 typically inclines to the first principal surface 11 so as to provide the unevenness of the second principal surface 25. Therefore, light incident on the surface of the antiglare film 20 is reflected in a direction different from a traveling direction of light resulting from regular reflection on the portion of the first principal surface 11 as the exposed portion 12. Accordingly, the place where a reflection image is formed differs depending on the place at which incident light is reflected. As a result, a reflection image synthesized from light reflected by the second principal surface 25 is unsharp and the antiglare film-attached substrate 1a can exhibit desired antiglare properties.

The surface of the antiglare film 20 inclines to the first principal surface 11, and transmitted light rays passing through the antiglare film 20 tend to change its path to travel. However, because the antiglare film-attached substrate 1a includes the exposed portion 12, a portion of transmitted light rays can pass through the substrate 10 only. Such transmitted light rays passing through the substrate 10 only tend to travel without changing its path. This is advantageous in keeping sharpness of a transmission image.

For the second principal surface 25, the arithmetic average roughness Ra, the maximum height Rz, and the average length RSm of roughness profile elements, as defined in Japanese Industrial Standards (JIS) B 0601-2001, for example, satisfy the following requirements (i), (ii), and (iii). This allows the antiglare film-attached substrate 1a to exhibit good antiglare properties.

(i) The arithmetic average roughness Ra is 0.08 to 2 μm.
(ii) The maximum height Rz is 0.5 to 15 μm.
(iii) The average length RSm of roughness profile elements is 15 to 50 μm.

For the second principal surface 25, the arithmetic average roughness Ra may be 0.08 to 1.5 μm or 0.08 to 1 μm. For the second principal surface 25, the maximum height Rz may be 0.8 to 13 μm or 0.7 to 1.2 μm. For the second principal surface 25, the average length RSm of roughness profile elements may be 17 to 48 μm or 20 to 45 μm.

For the exposed portion 12 of the first principal surface 11, the arithmetic average roughness Ra is, for example, 0 to 1 nm, desirably 0.1 to 0.5 nm, and more desirably 0.1 to 0.3 nm. In this case, regular refection of incident light tends to occur on the exposed portion 12 of the first principal surface 11 and transmitted light rays passing through the substrate 10 only tend to travel without changing its path.

The antiglare film 20 includes, for example, particles 21 and a binder 22. The particles 21 have, for example, a primary particle diameter of 0.5 to 15 μm. The binder 22 surrounds the particles 21 when viewed in plan. The particles 21 and the binder 22 make it easy for the second principal surface 25 to have the desired unevenness.

In the antiglare film 20, the particles 21 may be away from each other, or secondary particles may be formed as a result of aggregation of at least a portion of the particles 21. The secondary particles have a particle diameter of, for example, 10 μm or less. Herein, the primary particle diameter and secondary particle diameter of the particles 21 are the maximum diameters determined when the antiglare film 20 is viewed in plan.

In the antiglare film 20, the thickness of the binder 22 is, for example, smaller than a dimension of each of the particles 21 surrounded by the binder 22. The dimension is defined in the thickness direction of the binder 22. As just described, the particles are surrounded by the binder 22 having a thickness smaller than the dimension of each of the particles 21 in the thickness direction, and that makes it easy for the second principal surface 25 to have the desired unevenness. The thickness direction of the binder 22 can be the direction perpendicular to the first principal surface 11.

The binder 22 surrounding the particles 21 desirably forms an inclined surface inclined to the first principal surface 11. For this inclined surface, the thickness of the binder 22 gradually increases as the distance from the particle 21 decreases in the vicinity of the particle 21. Such an inclined surface formed by the binder 22 makes it easy for the second principal surface 25 to have the desired unevenness.

In the antiglare film 20, the ratio (Vb/Vp) of the volume (Vb) of the binder 22 to the volume (Vp) of the particles 21 is, for example, 5/3 to 9. This makes it easy for the second principal surface 25 to have the desired unevenness.

In the antiglare film 20, the ratio (Mb/Mp) of the mass (Mb) of the binder 22 to the mass (Mp) of the particles 21 is, for example, 5/3 to 9. This makes it easy for the second principal surface 25 to have the desired unevenness.

The particles 21 can be formed of an organic material, an inorganic material, or a hybrid material of an organic material and an inorganic material. The binder 22 can be formed of an organic material, an inorganic material, or a hybrid material of an organic material and an inorganic material. The main component of the particles 21 is, for example, silicon dioxide ($SiO_2$). The main component of the binder 22 is, for example, silicon dioxide. The main components of the particles 21 and the binder 22 may be silicon dioxide. In this case, the particles 21 and the binder 22 are likely to have a desired mechanical strength. Moreover, in this case, the adhesion between the particles 21 and the binder 22 is good. The term "main component" as used herein refers to a component whose content is the highest on a mass basis.

The particles 21 may consist essentially of silicon dioxide. Being "consisting essentially of silicon dioxide" herein means that no other components than silicon dioxide are included intentionally, except for impurities inevitably introduced, for example, for production-related reasons. When the particles 21 consist essentially of silicon dioxide, the content of other components included in the particles 21 than silicon dioxide is, for example, 1% or less, desirably 0.1% or less, and more desirably 0.01% or less on a mass basis. The binder 22 may include an organic component in an amount of 10 mass % or less. The particles 21 may consist essentially of silicon dioxide and the binder 22 may include the organic component in an amount of 10 mass % or less.

The binder 22 includes, for example, a hydrolysis-polycondensation product of a functional alkoxysilane. In this case, the binder 22 can be formed, for example, by a sol-gel process.

The substrate 10 is not particularly limited as long as the substrate 10 is transparent to visible light. The substrate 10 includes, for example, glass. The glass may be soda-lime silicate glass or aluminosilicate glass. The substrate 10 may be made of a resin.

When the substrate 10 includes the glass, the glass may have a compressive stress layer serving as a surface of the glass. The compressive stress layer can be formed, for example, by applying any known strengthening treatment such as thermal tempering or chemical strengthening to the glass.

The substrate 10 may include a coating serving as the first principal surface 11 and a support supporting the coating and made of the glass. The substrate 10 includes a coating for a given purpose, for example, adjustment of the surface roughness of the first principal surface 11, improvement of the adhesion between the substrate 10 and the antiglare film 20, reduction of mass transfer between the substrate 10 and the antiglare film 20, or improvement of weather resistance of the substrate 10. The coating is, for example, formed of an organic material, an inorganic material, or a hybrid material of an organic material and an inorganic material.

The substrate 10 is, for example, in the shape of a sheet. In this case, the substrate 10 can include a glass sheet or a resin sheet.

As shown in FIG. 1A and FIG. 1B, the antiglare film 20 has, for example, an interconnected structure where the antiglare film 20 and the exposed portion 12 are intermingled with each other when viewed in plan. In other words, the antiglare film 20 and the exposed portion 12 are interlocked like jigsaw puzzle pieces. In this case, the area of the antiglare film 20 is easily increased.

For the antiglare film-attached substrate 1a, the specular glossiness $G_S$ (60°) of 600 specular gloss, as defined in JIS Z 8741-1997, is, for example, 40 to 110. The glossiness of the antiglare film-attached substrate 1a can thus be adjusted in the wide range. Additionally, for the antiglare film-attached substrate 1a, the haze as defined in JIS K 7136: 2000 is, for example, 5 to 30%. The haze of the antiglare film-attached substrate 1a is thus adjusted in the appropriate range. In the case of a glass substrate having a smooth surface, the specular glossiness $G_S$ (60°) is commonly 150 to 160.

A given image display apparatus can be provided using the antiglare film-attached substrate 1a. For example, an image display apparatus includes: an image display unit having a screen; and the antiglare film-attached substrate 1a. In the image display apparatus, the antiglare film-attached substrate 1a is disposed in such a manner that the substrate 10 is located between the screen of the image display unit and the antiglare film 20. The image display unit can be, for example, a flat panel display such as a liquid crystal display or an organic electroluminescence display.

A given digital signage can be provided using the antiglare film-attached substrate 1a. For example, a digital signage includes: an image display unit having a screen; and the antiglare film-attached substrate 1a. In this case, the substrate 10 typically includes glass. In the digital signage, the antiglare film-attached substrate 1a is disposed in such a manner that the substrate 10 is located between the screen of the image display unit and the antiglare film 20. The image display unit can be, for example, a flat panel display such as a liquid crystal display or an organic electroluminescence display.

Figure 2A:
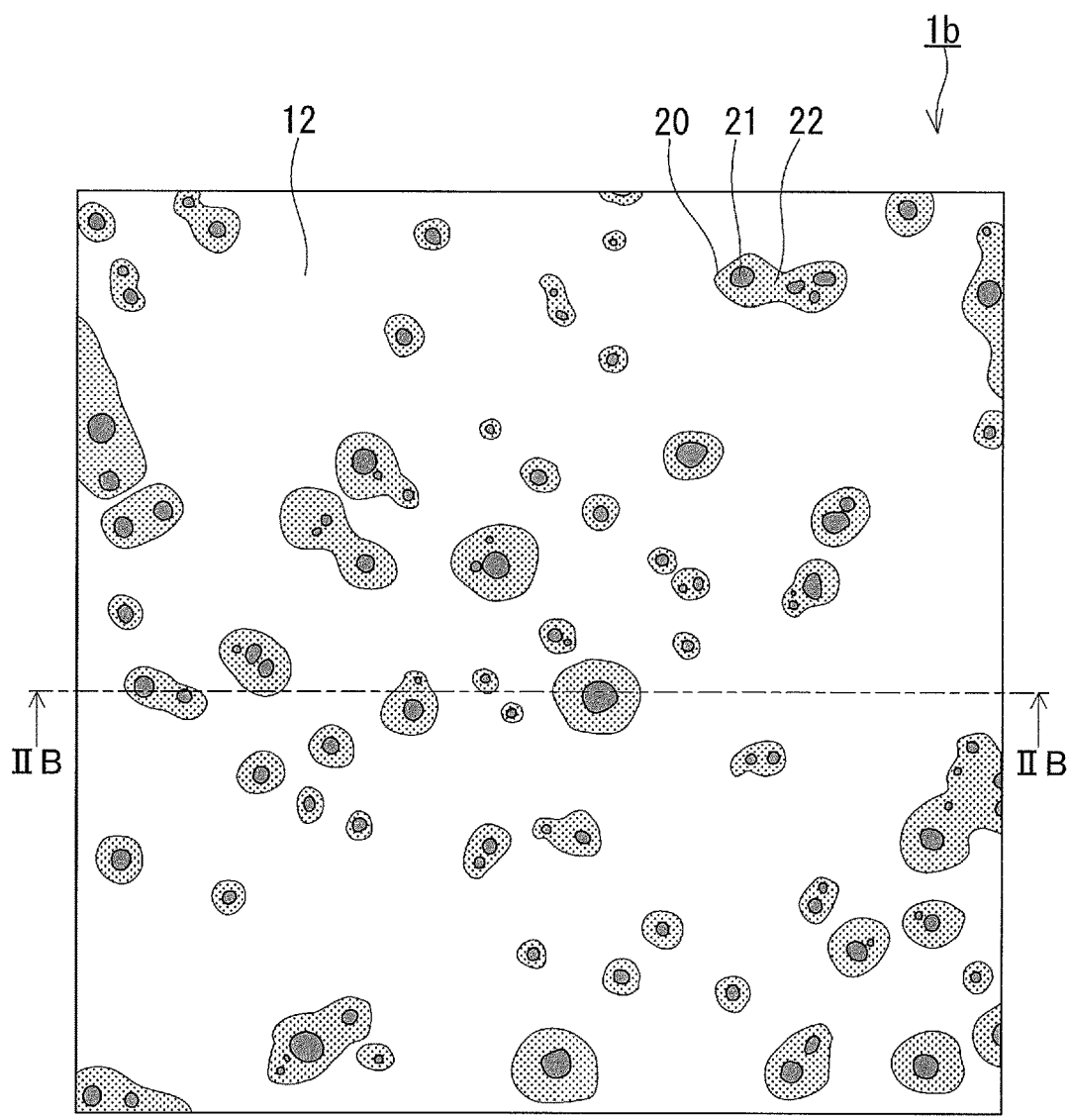
FIG. 2A is a plan view schematically showing an antiglare film-attached substrate according to another example of the present invention.
Figure 2B:
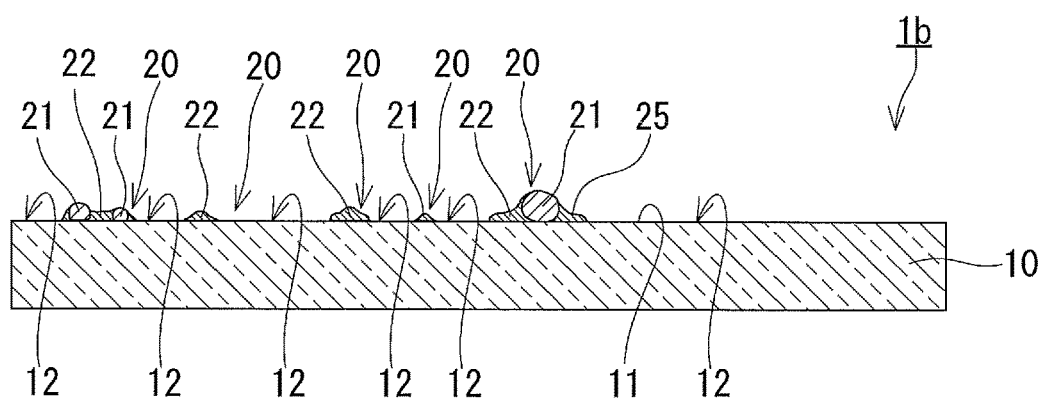
FIG. 2B is a cross-sectional view of the antiglare film-attached substrate viewed along the line IIB-IIB in FIG. 2A.

The antiglare film-attached substrate 1a may be modified to, for example, an antiglare film-attached substrate 1b shown in FIG. 2A and FIG. 2B. The antiglare film-attached substrate 1b is configured in the same manner as the antiglare film-attached substrate 1a, unless otherwise described. The components of antiglare film-attached substrate 1b that are the same as or correspond to those of the antiglare film-attached substrate 1a are denoted by the same reference characters, and detailed descriptions of such components are omitted. The description given for the antiglare film-attached substrate 1a can apply to antiglare film-attached substrate 1b, unless there is technical inconsistency.

As shown in FIG. 2A and FIG. 2B, the antiglare film 20 has, for example, a sea-island structure in which the antiglare film 20 is in the form of a grain and is isolated when viewed in plan. In this case, the area of the exposed portion 12 is likely to be increased.

An example of the method for manufacturing the antiglare film-attached substrate 1a and the antiglare film-attached substrate 1b will be described. First, a glass sheet or a resin sheet, for example, is prepared as the substrate 10. A principal surface of the glass sheet or resin sheet may serve as the first principal surface 11. Alternatively, the first principal surface 11 may be formed by subjecting a principal surface of the glass sheet or resin sheet to a given treatment such as polishing or coating, if necessary.

Next, the antiglare film 20 is formed on the first principal surface 11 of the substrate 10, for example, by a sol-gel process using a coating liquid containing raw materials of the antiglare film 20. The coating liquid contains the particles 21 and a precursor of the binder 22. The precursor of the binder 22 is, for example, a functional alkoxysilane. The coating liquid further contains, for example, water and an acid serving as a catalyst in a gelation reaction, and may further contain a given additive such as a surfactant, if necessary. The coating liquid may contain a hydrolysate of a functional alkoxysilane, instead of the functional alkoxysilane or in addition to the functional alkoxysilane. A dispersion of the particles 21 may be used in preparation of the coating liquid. A dispersion medium of the dispersion of the particles 21 can be water or a liquid organic compound such as an alcohol.

A coating film is formed by applying the coating liquid to the first principal surface 11 of the substrate 10. The coating film is hardened by drying and heating to form the antiglare film 20. The antiglare film-attached substrate 1a or the antiglare film-attached substrate 1b is obtained in this manner. The method of applying the coating liquid to the first principal surface 11 of the substrate 10 is, for example, a method such as roll coating, spray coating, or spraying. In terms of mass production, the method of applying the coating liquid to the first principal surface 11 of the substrate 10 is desirably roll coating. The coating film is heated at an ambient temperature of, for example, 100 to 500° C.

EXAMPLES

Hereinafter, the present invention will be described in more detail by examples. The present invention is not limited to the examples given below. First, the methods of evaluating samples according to Examples and Comparative Example will be described.

(Optical Properties)

The specular glossiness $G_S$ (60°) of 60° specular gloss, as defined in JIS Z 8741-1997, was measured for the samples according to Examples and Comparative Example using a gloss checker (manufactured by HORIBA, Ltd.; product name: Handy Gloss Checker IG-320). Table 1 shows the results. The haze as defined in JIS K 7136-2000 and the total light transmittance were measured for the samples according to Examples and Comparative Example using a haze meter (manufactured by NIPPON DENSHOKU INDUSTRIES CO., LTD.; product name: NDH 2000). Table 1 shows the results.

(Surface Profile)

The surface profiles of the samples according to Examples and Comparative Example were measured using a laser microscope (manufactured by Lasertec Corporation; product name: OPTELICS HYBRID). The arithmetic average roughness Ra, the maximum height Rz, and the average length RSm of roughness profile elements, as defined in JIS B 0601-2001, were determined. Table 1 shows the results.

(Optical Microscopic Observation of Antiglare Film)

Plan-view images of antiglare films of the samples according to Examples and Comparative Example were obtained using an optical microscope. Each image was subjected to image processing to determine the area of the antiglare film and the area of an exposed portion of a substrate, and then the proportion (Sa/St) of the area (Sa) of the antiglare film in the sum (St) of the area of the antiglare film and the area of the exposed portion of the substrate was determined. Table 1 shows the results.

(Antiglare Properties)

The substrates of the samples according to Examples and Comparative Example were each attached to a black plastic sheet. A reflection of light of a fluorescent lamp on the antiglare film of the sample was visually observed. Then, sharpness of an image, for example, of the fluorescent lamp reflected on the antiglare film, was visually evaluated based on the following criteria. Table 1 shows the results.

A: The image of the fluorescent lamp is totally ignorable.
G: The image of the fluorescent lamp is sharp and unignorable.

Example 1

52.01 g of ethyl orthosilicate, 20.94 g of propylene glycol monomethyl ether, 26.05 g of purified water, and 1.00 g of a 1 N aqueous nitric acid solution were mixed, followed by a reaction at 40° C. for 8 hours to obtain a raw material liquid A. The solids concentration in the raw material liquid A was 15 mass %.

Propylene glycol monomethyl ether, propylene glycol, a diluted solution (concentration of PCL: 50 mass %) of polycaprolactone triol (PCL), a dispersion A (concentration of silica: 69 mass %) containing silica particles (manufactured by Denka Company Limited; product name: FB-3SDC; median diameter of silica particles: 3.1 μm) dispersed in water, the raw material liquid A, 3-glycidoxypropyltrimethoxysilane (GPTMS), and a silicone surfactant (manufactured by Shin-Etsu Chemical Co., Ltd.; product name: KP-341) were mixed in the amounts shown in Table 2 to prepare a coating liquid according to Example 1. The median diameter means the particle diameter (d50) at 50% in a volume-based cumulative particle size distribution.

A glass sheet having the common soda-lime silicate composition was cut to a given size to prepare a substrate. The glass sheet had a smooth principal surface capable of regular reflection of incident light. The coating liquid according to Example 1 was applied to the principal surface of the substrate by roll coating to form a coating film. In the roll coating, the substrate conveying speed was adjusted to 10 m/min, the rotational speed of an application roller was adjusted to 10 m/min, and the gap between a conveying roller and the application roller was adjusted to 3.5 mm. Subsequently, the coated substrate was placed in an oven at 300° C. for 4 minutes to harden the coating film and thereby form an antiglare film. A sample according to Example 1 was obtained in this manner.

Examples 2 to 7

Samples according to Examples 2 to 7 were produced in the same manner as in Example 1, except for the following points. In Example 2, a coating liquid according to Example 2 was prepared by mixing the raw materials in the amounts shown in Table 2 using a dispersion B (concentration of silica: 54 mass %) containing silica particles (manufactured by NIPPON SHOKUBAI CO., LTD.; product name: KE-P150, nominal particle diameter of silica particles: 1.5 μm) dispersed in water instead of the dispersion A of the silica particles. In Example 3, a coating liquid according to Example 3 was prepared by mixing the raw materials in the amounts shown in Table 2 using a dispersion C (manufactured by NIPPON SHOKUBAI CO., LTD.; product name: KE-W50; nominal particle diameter of silica particles: 0.5 μm; concentration of silica: 20 mass %) of silica particles instead of the dispersion A of the silica particles. Coating liquids according to Examples 4 to 7 were prepared by mixing the raw materials in the amounts shown in Table 2 using the dispersion A of the silica particles as a dispersion of silica particles. Samples according to Examples 2 to 7 were produced using, instead of the coating liquid according to Example 1, the coating liquids according to Examples 2 to 7 respectively in the formation of antiglare films.

COMPARATIVE EXAMPLE

A glass sheet of the same type as the glass sheet used as the substrate in Example 1 was cut to a given size to obtain a sample according to Comparative Example. The surface profile of the sample according to Comparative Example was measured to determine that the arithmetic average roughness Ra was on the order of several nanometers to several tens of nanometers. The maximum height Rz was nearly 0 μm, and the average length RSm of roughness profile elements was outside a measurable range.

As shown in Table 1, the samples according to Examples had antiglare properties. Additionally, it is suggested that the specular glossiness $G_S(60°)$ thereof can be adjusted in a wide range with the use the samples according to Examples. Furthermore, the haze of the samples according to Examples was as low as 30% or less. As indicated above, the samples according to Examples had advantageous properties in terms of the antiglare properties, gloss properties, and haze.

TABLE 1

|  | Antiglare film Ratio of mass Mb of binder to mass Mp of particles [Mb/Mp] | Optical properties | | | Surface profile | | | Proportion of area of antiglare film (Sa/St) [%] | Antiglare properties |
|---|---|---|---|---|---|---|---|---|---|
|  |  | Specular glossiness $G_S$ (60°) | Haze [%] | Total light transmittance [%] | Ra [μm] | Rz [μm] | RSm [μm] |  |  |
| Example 1 | 80/20 | 45.5 | 24.4 | 90.2 | 0.34 | 7.22 | 31.82 | 65.7 | A |
| Example 2 | 78.2/21.8 | 63.6 | 20.9 | 91.6 | 0.15 | 1.67 | 32.44 | 57.9 | A |
| Example 3 | 80/20 | 94.3 | 8.9 | 91.4 | 0.098 | 1.15 | 21.4 | 85.3 | A |
| Example 4 | 80/20 | 60.9 | 17.9 | 90.9 | 0.22 | 6.6 | 32.85 | 42.2 | A |
| Example 5 | 80/20 | 70.7 | 17.0 | 90.8 | 0.25 | 6.89 | 32.93 | 33.8 | A |
| Example 6 | 80/20 | 98.9 | 8.2 | 91.3 | 0.13 | 3.56 | 40.89 | 16.2 | A |
| Example 7 | 65/35 | 45.4 | 27.8 | 90.3 | 0.44 | 9.14 | 39.56 | 75.4 | A |
| Comparative Example | — | 150 | <0.005 | 92.0 |  |  |  | 0 | G |

TABLE 2

|  | Example 1 | Example 2 | Example 3 | Example 4 | Example 5 | Example 6 | Example 7 |
|---|---|---|---|---|---|---|---|
| Propylene glycol monomethyl ether [g] | 1.87 | 40.45 | 38.15 | 16.01 | 23.08 | 30.15 | 8.03 |
| Propylene glycol [g] | 48.00 | 48.00 | 48.00 | 48.00 | 48.00 | 48.00 | 48.00 |
| Diluted solution of PCL [g] | 2.00 | 2.00 | 2.00 | 2.00 | 2.00 | 2.00 | 2.00 |
| Dispersion of silica particles [g] | 2.86 | 0.71 | 2.00 | 2.00 | 1.57 | 1.14 | 5.01 |
| Raw material liquid A [g] | 42.67 | 7.56 | 8.53 | 29.87 | 23.47 | 17.07 | 34.67 |
| 3-Glycidoxypropyltrimethoxysilane [g] | 1.60 | 0.28 | 0.32 | 1.12 | 0.88 | 0.64 | 1.30 |
| Silicone surfactant [g] | 1.00 | 1.00 | 1.00 | 1.00 | 1.00 | 1.00 | 1.00 |
| Total weight [g] | 100.00 | 100.00 | 100.00 | 100.00 | 100.00 | 100.00 | 100.00 |
| Solids concentration [mass %] | 10.0 | 1.8 | 2.0 | 7.0 | 5.5 | 4.0 | 10.0 |
| Particle diameter of silica particles [μm] | 3.1 | 1.5 | 0.5 | 3.1 | 3.1 | 3.1 | 3.1 |

The invention claimed is:

1. An antiglare film-attached substrate comprising:
a substrate comprising a first principal surface, a portion of the first principal surface being exposed; and
an antiglare film covering another portion of the first principal surface, wherein
the antiglare film-attached substrate comprises a second principal surface having unevenness and formed of the first principal surface and the surface of the antiglare film,
when the second principal surface is viewed in plan, the area of the antiglare film accounts for 10 to 90% of the area of the second principal surface, and
for the second principal surface, the arithmetic average roughness Ra, the maximum height Rz, and the average length RSm of roughness profile elements, as defined in Japanese Industrial Standards (JIS) B 0601-2001, satisfy the following requirements (i), (ii), and (iii):

(i) the arithmetic average roughness Ra is 0.08 to 2 μm;
(ii) the maximum height Rz is 0.5 to 15 μm; and
(iii) the average length RSm of roughness profile elements is 15 to 50 μm.

2. The antiglare film-attached substrate according to claim 1, wherein
the antiglare film comprises particles having a primary particle diameter of 0.5 to 15 μm and
a binder surrounding the particles when viewed in plan.

3. The antiglare film-attached substrate according to claim 2, wherein the particles are away from each other.

4. The antiglare film-attached substrate according to claim 2, wherein the antiglare film comprises secondary particles which are formed by aggregation of at least a portion of the particles and have a particle diameter of 10 μm or less.

5. The antiglare film-attached substrate according to claim 2, wherein the thickness of the binder is smaller than a dimension of each of the particles surrounded by the binder, the dimension being defined in the thickness direction of the binder.

6. The antiglare film-attached substrate according to claim 2, wherein the ratio of the volume of the binder to the volume of the particles is 5/3 to 9 in the antiglare film.

7. The antiglare film-attached substrate according to claim 2, wherein the ratio of the mass of the binder to the mass of the particles is 5/3 to 9 in the antiglare film.

8. The antiglare film-attached substrate according to claim 2, wherein
the main component of the particles is silicon dioxide and the main component of the binder is silicon dioxide.

9. The antiglare film-attached substrate according to claim 2, wherein
the particles consist essentially of silicon dioxide and
the binder comprises an organic component in an amount of 10 mass % or less.

10. The antiglare film-attached substrate according to claim 1, wherein
the specular glossiness $G_S$ (60°) of 60° specular gloss, as defined in JIS Z 8741-1997, is 40 to 110 and
the haze as defined in JIS K 7136-2000 is 5 to 30%.

11. The antiglare film-attached substrate according to claim 1, wherein the substrate comprises glass.

12. The antiglare film-attached substrate according to claim 11, wherein the glass is at least one selected from the group consisting of soda-lime silicate glass and aluminosilicate glass.

13. The antiglare film-attached substrate according to claim 11, wherein the glass comprises a compressive stress layer serving as a surface of the glass.

14. The antiglare film-attached substrate according to claim 11, wherein the substrate comprises a coating serving as the first principal surface and a support supporting the coating and made of the glass.

15. An image display apparatus comprising:
an image display unit comprising a screen; and
the antiglare film-attached substrate according to claim 1 disposed in such a manner the substrate is located between the screen and the antiglare film.

16. A digital signage comprising:
an image display unit comprising a screen; and
the antiglare film-attached substrate according to claim 11 disposed in such a manner that the substrate is located between the screen and the antiglare film.

* * * * *